United States Patent
Nakamura

(10) Patent No.: US 6,404,748 B1
(45) Date of Patent: Jun. 11, 2002

(54) RECEIPT CIRCUIT FOR A TDMA RADIO APPARATUS

(75) Inventor: Futoshi Nakamura, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/025,440

(22) Filed: Feb. 17, 1998

(30) Foreign Application Priority Data

Feb. 19, 1997 (JP) .............................................. 9-034868

(51) Int. Cl.$^7$ ............................ H04J 3/10; H04B 15/00
(52) U.S. Cl. ...................................... 370/314; 370/347
(58) Field of Search ................................ 370/314, 337, 370/347, 278, 280, 504, 206, 208; 455/63, 67.3, 296, 307, 311, 317, 319, 254, 266, 403, 550, 174.1, 194.1, 222, 223; 375/346, 350, 351

(56) References Cited

U.S. PATENT DOCUMENTS

| 5,423,064 A | * | 6/1995 | Sakata | 455/550 |
| 5,521,561 A | * | 5/1996 | Yrjola | 333/103 |
| 5,602,835 A | * | 2/1997 | Seki et al. | 370/206 |
| 5,710,765 A | * | 1/1998 | Lee | 370/321 |
| 5,974,101 A | * | 10/1999 | Nago | 375/350 |
| 6,108,353 A | * | 8/2000 | Nakamura et al. | 370/504 |

FOREIGN PATENT DOCUMENTS

| EP | 0653858 A2 | * | 5/1995 |
| GB | 1155805 | | 3/1968 |
| GB | 1566393 | | 3/1978 |
| GB | 2 105 552 A | | 3/1983 |
| JP | Sho 58-9448 | | 1/1983 |
| JP | Sho 60-180262 | | 9/1985 |
| JP | Sho 60-180263 | | 9/1985 |
| JP | Sho 61-257034 | | 11/1986 |

OTHER PUBLICATIONS

The University of Bermingham School of Electronic and Electirical Engineering web page: "Making It Work Multipe Access—Time Dvision Multiple Access," Http://webteam.eee.bham.ac.uk/members/WeiChing/g5c2a2.htm, 01/1999.*
Sigtek, Inc. web page: "ST–105 Bit Sync & Demodulator FAQ," http://www.sigtek.com/products/st105/st105.faq.html, 10/2001.*
William C. Y. Lee, "Mobile Communications Design Fundamentals," 2nd edition, 1993, pp170–173.*

* cited by examiner

Primary Examiner—Edwin C. Holloway, III
(74) Attorney, Agent, or Firm—Whitham, Curtis & Christofferson, PC

(57) ABSTRACT

A receipt circuit for a TDMA (Time Division Multiple Access) radio apparatus of the present invention includes a switch selectively turned on or turned off in order to remove a residual signal component occurring in a guard time between consecutive time slots due to the group delay of a SAW (Surface Acoustic Wave) filter or a ceramic filter. The receipt circuit therefore obviates the fall of receipt sensitivity even when a TDMA signal of low level is input immediately after a slot in which a TDMA signal of high level has been input. In addition, the receipt circuit is free from the erroneous detection of an input electric field.

6 Claims, 4 Drawing Sheets

RECEIPT CIRCUIT FOR A TDMA RADIO APPARATUS

BACKGROUND OF THE INVENTION

The present invention relates to a receipt circuit included in a TDMA (Time Division Multiple Access) radio apparatus and, more particularly, to a receipt circuit for a TDMA radio apparatus of the type using a SAW (Surface Acoustic Wave) filter or a ceramic filter as band-pass filter for an IF (Intermediate Frequency) signal.

In one of conventional receipt circuits for a TDMA radio apparatus, a TDMA signal coming in through an antenna is input to an RF (Radio Frequency) amplifier via an input filter. The TDMA signal is amplified by the RF amplifier and then transformed to an IF signal by a mixer. An IF band-pass filter implemented by a SAW filter or a ceramic filter filters out needless signals and interference signals contained in the IF signal. A limiter amplifier amplifies the filtered IF signal while detecting its receipt electric field level. The resulting output of the limiter amplifier is fed to a demodulator.

The above receipt circuit apparatus has the following problems left unsolved. When a TDMA IF signal of high level is input to the SAW filter or the ceramic filter, the trailing edge of the signal is blunted at each time slot due to the influence of a group delay characteristic particular to the filter. Specifically, although the trailing edge is originally sharp, it is blunted by the SAW filter or the ceramic filter with the result that a component belonging to a preceding time slot remains in a guard time between the above time slot and the following time slot. It follows that when a TDMA signal of low level occurs immediately after the TDMA signal of high level, the receipt sensitivity of the former is lowered by the influence of the residual component of the latter. Moreover, if the residual component in the guard time is of high level, a carrier sensing function determines, even when an electric field is absent in the next time slot, that an input electric field is present. This practically disables the radio apparatus from communicating with another radio apparatus in both of a transmission time slot and a receipt time slot.

SUMMARY OF THE INVENTION

It is therefore an object of the present invention to provide a receipt circuit for a TDMA radio apparatus capable of obviating, when a TDMA IF signal of high level is input to a SAW filter or a ceramic filter, the fall of receipt sensitivity and the inability to communicate ascribable to the influence of the group delay characteristic particular to the filter.

A receipt circuit for a TDMA radio apparatus of the present invention includes a band-pass filter for an IF signal and implemented by either one of a SAW filter and a ceramic filter, and a removing circuit for removing a residual signal component remaining in a preselected guard time between consecutive time slots of a TDMA IF signal passed through the band-pass filter.

BRIEF DESCRIPTION OF THE DRAWINGS

The above and other objects, features and advantages of the present invention will become apparent from the following detailed description taken with the accompanying drawings in which.

Figure 1:
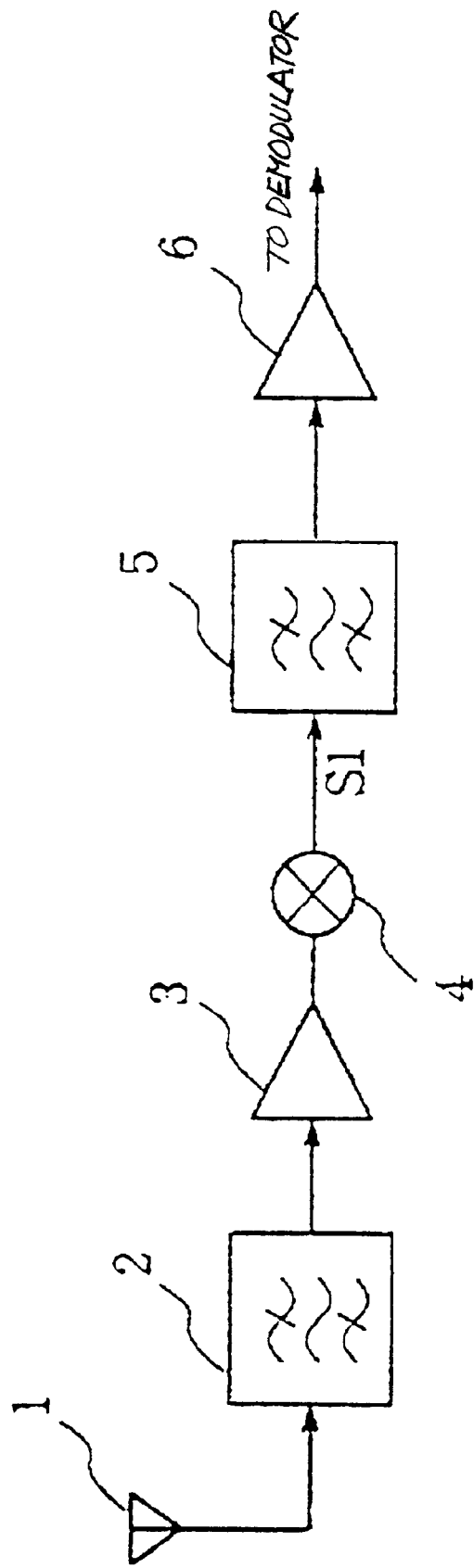
FIG. 1 is a block diagram schematically showing a conventional TDMA radio apparatus.

In the drawings, identical references denote identical structural elements.

DESCRIPTION OF THE PREFERRED EMBODIMENT

To better understand the present invention, brief reference will be made to a conventional receipt circuit for a TDMA radio apparatus. shown in FIG. 1. As shown, a TDMA signal coming in through an antenna 1 is input to an RF amplifier 3 via an input filter 2. The TDMA signal is amplified by the RF amplifier 3 and then transformed to an IF signal S1 by a mixer 4. An IF band-pass filter 5 implemented by a SAW filter or a ceramic filter is connected to the output of the mixer 4 in order to filter out needless signals and interference signals contained in the IF signal S1. A limiter amplifier 6 amplifies the filtered IF signal while detecting its receipt electric field level. The resulting output of the limiter amplifier 6 is fed to a demodulator not shown.

Figure 3:
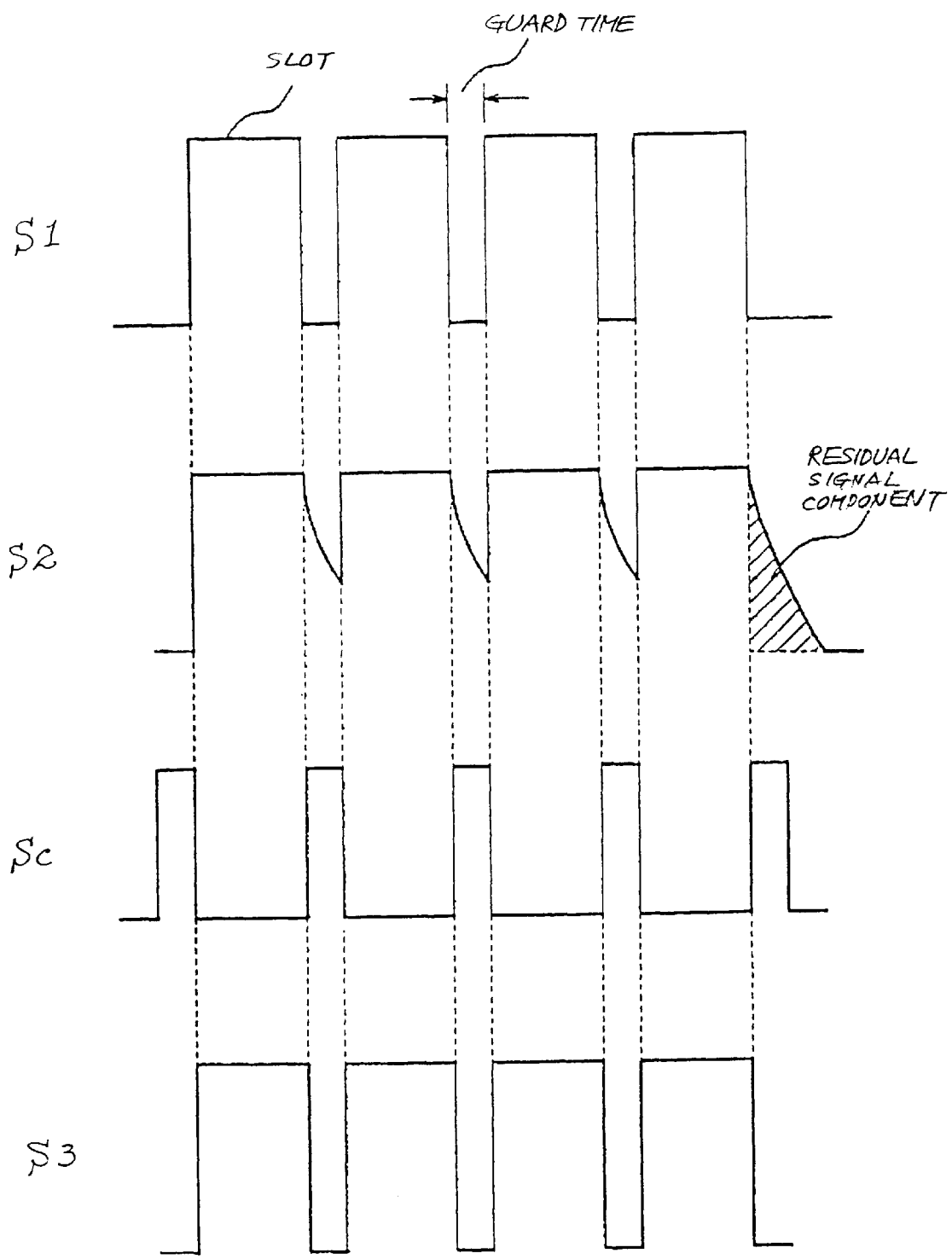
FIG. 3 shows waveforms demonstrating the operation of a switch included in the illustrative embodiment.

The problem with the above conventional receipt circuit is that when a TDMA IF signal of high level is input to the SAW filter or the ceramic filter 5, the trailing edge of the signal is blunted at each time slot due to the influence of a group delay characteristic particular to the filter 5. Specifically, FIG. 3 shows a signal S2 output from the bandpass filter 5. As shown, although the trailing edge of the signal S2 is originally sharp, it is blunted by the SAW filter or the ceramic filter 5, as indicated by hatching. Consequently, a component belonging to a preceding time slot remains in a guard time between the above time slot and the following time slot. It follows that when a TDMA signal of low level occurs immediately after the TDMA signal of high level, the receipt sensitivity of the former is lowered by the influence of the residual component of the latter. Moreover, if the residual component in the guard time is of high level, a carrier sensing function determines, even when an electric field is absent in the next time slot, that an input electric field is present. This practically disables the radio apparatus from communicating with another radio apparatus in both of a transmission time slot and a receipt time slot, as discussed earlier.

Figure 2:
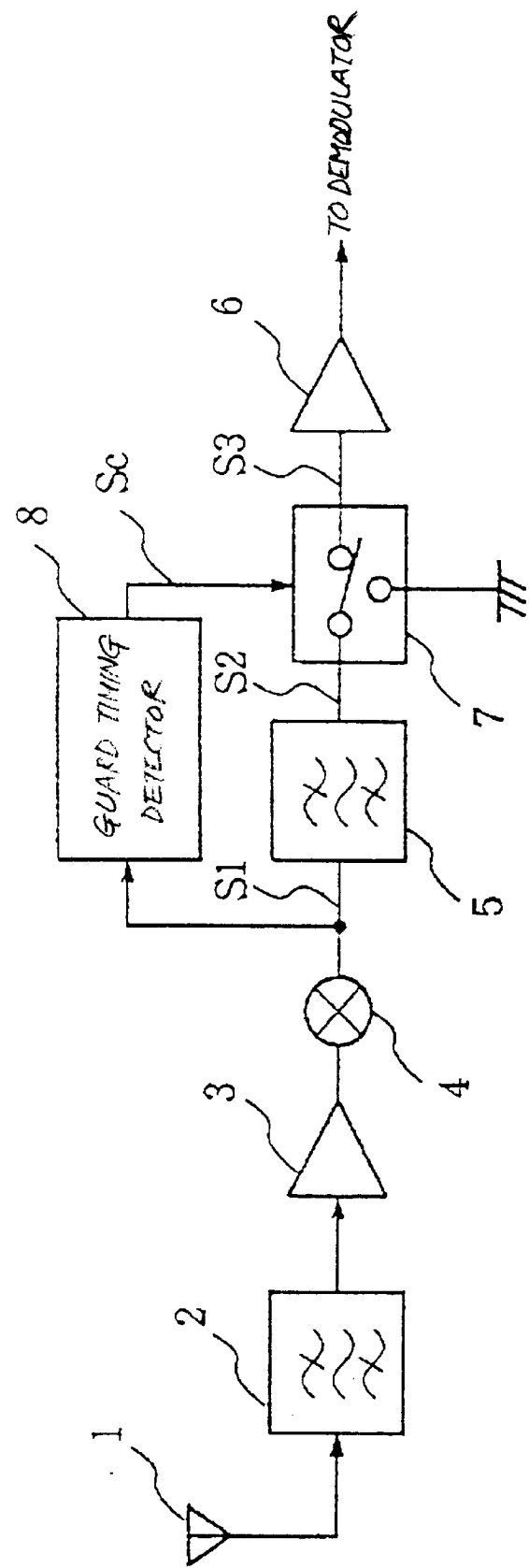
FIG. 2 is a block diagram schematically showing a receipt circuit included in a TDMA radio apparatus and embodying the present invention.

Referring to FIG. 2, a receipt circuit for a TDMA radio apparatus and embodying the present invention will be described. As shown, the receipt circuit includes an input filter 2 and an RF amplifier 3. A TDMA signal coming in through an antenna 1 is applied to the RF amplifier 3 via the input filter 2 and amplified thereby. A mixer 4 transforms the amplified signal output from the RF amplifier 3 to a TDMA IF signal S1. A band-pass filter 5 for an IF signal and implemented by a SAW filter or a ceramic filter filters out needless signals and interference signals contained in the IF signal S1. A limiter amplifier 6 amplifies the resulting output of the filter 5 and feeds its output to a demodulator not shown.

In the illustrative embodiment, a switch 7 is connected to the output of the IF filter 5 in order to selectively transfer the IF signal. labeled S2, output from the filter 5 to the demodulator. Specifically, a guard timing detector 8 feeds a control signal Sc to the switch 7. In response to the control signal Sc, the switch 7 selects the IF signal S2 only during the slot period of the received TDMA signal and feeds it to the demodulator via the limiter amplifier 6 as a signal S3.

The TDMA IF signal S1 output from the mixer 4 is fed to the guard timing detector 8 also. The detector 8 detects the timing of a guard time between consecutive time slots out of the IF signal S1 and delivers the control signal Sc representative of the above timing to the switch 7.

FIG. 3 shows the waveforms of the signals S1, S2, S3 and Sc for demonstrating the operation of the switch 7. As shown, the control signals Sc is assumed to go low for each slot period, but go high for each guard time. When the control signal Sc goes low, the switch 7 transfers the IF signal S2 output from the IF filter 5 to the demodulator. While the control signal Sc is in its low level, the switch 7 intercepts the IF signal S2. That is, the switch 7 forcibly removes residual signal components occurring during consecutive guard times from the IF signal S2. As a result, the IF signal S3 output from the switch 7 is free from such residual signal components.

Figure 4:
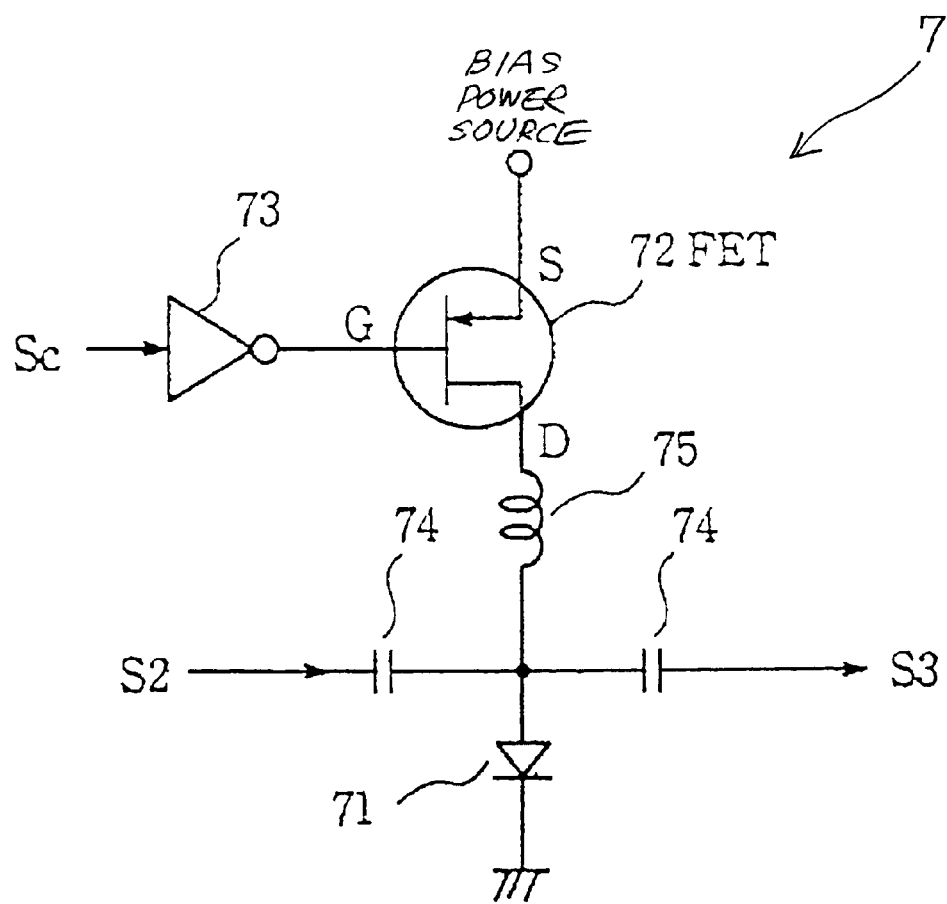
FIG. 4 is a circuit diagram showing a specific configuration of the switch of FIG. 3.

FIG. 4 shows a specific configuration of the switch 7. As shown, the switch 7 is made up of a pin diode 71, an FET (Field Effect Transistor) 72, an inverter 73, a capacitor 74, and a choke coil 75. The FET 72 applies a bias to the pin diode 71 in accordance with the control signal Sc. The inverter 73 inverts the polarity of the control signal Sc. The capacitor 7 4 is used to obstruct a DC component.

The pin diode 71 is connected between the IF signal line and ground and selectively turned on or turned off by the FET 72. The control signal Sc having its polarity inverted by the inverter 73 is applied to the gate of the FET 72. The FET 72 applies a bias to the pin diode 71 such that the diode 71 turns off when the control signal Sc goes low (slot period) or turns on when the signal Sc goes high (guard time). During slot period, i.e., while the pin diode 71 is turned off, the IF signal i s transferred to the demodulator. During guard time, i.e., while the pin diode 71 is turned on, the IF signal is discharged to ground without being transferred to the demodulator.

As stated above, the illustrative embodiment is capable of filtering out residual signal components occurring during guard times due to the influence of the group delay characteristic of a SAW filter or a ceramic filter.

The pin diode 71 connected between the IF signal line and ground may alternatively be serially connected to the IF signal line, if desired. Further, the pin diode 71 may be replaced with any other suitable kind of diode or an electromagnetic switch operable at high speed.

In summary, it will be seen that the present invention provides a receipt circuit for a TDMA radio apparatus and capable of obviating the fall of receipt sensitivity even when a TDMA signal of low level is input immediately after a slot in which a TDMA signal of high level has been input. In addition, the receipt circuit is free from the erroneous detection of an input electric field otherwise brought about by a residual signal component occurring in a guard time due to the group delay characteristic of a SAW filter or a ceramic filter. These advantages are derived from a unique configuration in which a switch is selectively turned on or turned off in order to remove the residual signal component.

Various modifications will become possible for those skilled in the art after receiving the teachings of the present disclosure without departing from the scope thereof.

What is claimed is:

1. A receipt circuit for a time division multiple access (TDMA) radio apparatus, comprising:
    a band-pass filter for an IF signal implemented by either one of a SAW filter and a ceramic filter; and
    removing means for removing a residual signal component remaining in a preselected guard time between consecutive time slots of a TDMA IF signal passed through said band-pass filter, said removing means comprising:
        a detector for detecting a period between consecutive time slots comprising the preselected guard time and outputting a control signal representative of a timing of the guard time; and
        a switch selectively turned on or turned off by the control signal to disconnect said TDMA IF signal during said guard time.

2. A receipt circuit as claimed in claim 1, wherein said switch comprises:
    a diode connected between an output signal line of said band-pass, filter and ground; and
    a transistor for applying a bias to said diode in accordance with the control signal.

3. A receipt circuit as claimed in claim 1, wherein said switch comprises:
    a diode serially connected to an output signal line of said band-pass filter; and
    a transistor for applying a bias to said diode in accordance with the control signal.

4. A receipt circuit as claimed in claim 3, wherein said switch comprises an electromagnetic switch to be driven by said transistor at a high speed.

5. A receipt circuit as claimed in claim 2, wherein said switch comprises an electromagnetic switch to be driven by said transistor at a high speed.

6. A method for removing a residual signal component during a guard time between consecutive time slots of a time division multiple access (TDMA) signal, comprising the steps of:
    receiving a TDMA signal comprising a plurality of consecutive time slots each separated by a guard time slot;
    converting said TDMA signal into an intermediate frequency (IF) signal;
    detecting a period between consecutive time slots in said TDMA signal, said period comprising said guard time slot;
    passing said IF signal through a bandpass filter, said bandpass filter leaving a residual signal component in said guard time slot;
    providing a switch between said bandpass filter and a demodulator for demodulating said IF signal;
    closing said switch to supply said IF signal to said demodulator during said consecutive time slots; and
    opening said switch to disconnect said IF signal from said demodulator during said detected guard time to remove said residual signal component.

* * * * *